United States Patent [19]
Kim

[11] Patent Number: 5,910,679
[45] Date of Patent: Jun. 8, 1999

[54] METHOD FOR FABRICATING SEMICONDUCTOR DEVICE HAVING A CRACK RESISTANT CONTACT HOLE AND A SEMICONDUCTOR DEVICE HAVING A CRACK RESISTANT HOLE

[75] Inventor: So Yon Kim, Chungcheongbuk-do, Rep. of Korea

[73] Assignee: LG Semiconductor Co., Ltd., Cheongju-Si, Rep. of Korea

[21] Appl. No.: 08/962,269

[22] Filed: Oct. 31, 1997

[30] Foreign Application Priority Data

Dec. 30, 1996 [KR] Rep. of Korea ............ 96-76874

[51] Int. Cl.[6] .......... H01L 29/06; H01L 23/48; H01L 23/52; H01L 29/40

[52] U.S. Cl. ............................ 257/622; 257/774
[58] Field of Search ......................... 257/774, 622

Primary Examiner—Stephen D. Meier

[57] ABSTRACT

A method for fabricating a semiconductor device having a crack resistant contact hole and such a semiconductor device include a lower layer pattern formed over a scribe lane region of a semiconductor substrate. An insulating film is then formed over the semiconductor substrate including the lower layer pattern. Next, the insulating film is partially removed to form a contact hole and a groove surrounding the contact hole. The contact hole exposes the lower layer pattern. Since the groove surrounding the contact hole reduces compressive stress and tensile stress, it is possible to prevent a crack from occurring at the contact hole.

9 Claims, 3 Drawing Sheets

METHOD FOR FABRICATING SEMICONDUCTOR DEVICE HAVING A CRACK RESISTANT CONTACT HOLE AND A SEMICONDUCTOR DEVICE HAVING A CRACK RESISTANT HOLE

BACKGROUND OF THE INVENTION

1. Field of the Invention

The present invention relates to a semiconductor device having a crack resistant contact hole pattern, and to a method for fabricating a semiconductor device having a crack resistant contact hole.

2. Discussion of the Related Art

In general, performing process steps on a wafer requires a high degree of accuracy. In addition, it is necessary to remove either a wafer having a low yield or a wafer which does not have a standard size. In this regard, it is necessary to test and evaluate the wafer after respective process steps.

For such test and evaluation, a test pattern is formed in a scribe lane surrounding chips on the wafer to evaluate the wafer after completing respective process steps. Alternatively, a test wafer such as a void wafer or a wafer scrap included in a wafer holder may be used to evaluate main process steps.

It is important to align the wafer to associate a previous process step and the next process step. If the next process step is performed when the wafer is not adequately aligned, a low quality wafer with a reduced yield will likely be the result.

For this reason, study continues to improve alignment accuracy between a previous process step and the next process step by forming a pattern and a photo key, for monitoring the process steps, in the scribe lane surrounding the chips on the wafer.

The pattern and the photo key for monitoring the process steps in one frame of a conventional semiconductor device will be described with reference to the accompanying drawings.

FIG. 1 is a plane view of one frame in a conventional wafer. Referring to FIG. 1, a wafer 1 includes chips 2 for forming semiconductor devices and a scribe lane 3. The scribe lane 3 surrounds the chips 2 and allows the chips 2 to be separated from one another. One chip 2 and a scribe lane 3 surrounding the chip 2 are included in one frame. The wafer 1 further includes a test device such as an engineering test die for controlling quality during the sequence of process steps, an edge die formed at edge portions of the wafer 1, and wafer flats for indicating the crystal structure of the wafer. The edge die is also called an unfinished die. In addition, the scribe lane 3 surrounding the chips 2 includes a test pattern 4 and a variety of photo keys 5 for monitoring the process steps. The test pattern 4 evaluates whether the previous process step has been successfully performed. The photo keys 5 are used to monitor process steps such as aligning the wafer 1. Although the shape of the photo keys 5 depends on the equipment forming the photo keys 5, they are generally formed in a rectangular shape.

A method for forming a contact hole serving as a photo key, used to monitor the process steps, in the scribe lane of one frame will be described below with reference to the accompanying drawings.

FIG. 2 is a plane view of a contact hole in a scribe lane in one frame of a conventional semiconductor device. FIG. 3a to FIG. 3c are sectional views of the conventional process steps taken along line III—III of FIG. 2.

Referring to FIG. 2, a contact hole 14 has a lower layer pattern 11 formed on a predetermined region of a scribe lane region of a semiconductor substrate 10. An insulating film 13 is formed over the lower layer pattern 11 to protect, insulate and planarize the lower layer pattern 11. The contact hole 14 is formed by selectively removing some portion of the insulating film 13. The contact hole 14 has a rectangular shape.

As shown in FIG. 3a, a lower layer is formed on a semiconductor substrate 10 in which a chip region (not shown) and a scribe lane region are defined. The lower layer is selectively patterned by photolithography and etching processes to form a lower layer pattern 11 on the semiconductor substrate 10. The lower layer pattern 11 is formed having desired dimensions in the scribe lane region on the semiconductor substrate 10, and is formed with dimensions suitable for monitoring the process steps.

As shown in FIG. 3b, a first insulating film 12 and a second insulating film 13 are sequentially formed over the entire surface of the semiconductor 10 including the lower layer pattern 11. The first insulating film 12 insulates or protects the lower layer pattern 11. The first insulating film 12 also includes an oxide film or a nitride film. The second insulating film 13 is formed of an inter layer dielectric (ILD) layer including borophosphosilicate glass (BPSG).

As shown in FIG. 3c, the first and second insulating films 12 and 13 are selectively patterned to form the contact hole 14 for monitoring the process steps. The contact hole 14 is a photo key.

After the second insulating film 13 is formed, the surface of the semiconductor substrate 10 is heat treated to improve planarization.

In the conventional method for forming a contact hole in a semiconductor device, the ILD layer including the BPSG is formed over the entire surfaces of the semiconductor substrate having the chip region and the scribe lane region, and is selectively etched to form the contact hole. The chip region is heat treated to improve planarization. When such a large sized contact hole is formed as the photo key for monitoring the process steps, cracks irregularly occur due to tensile stress in the contact hole and compressive stress between the lower layer pattern 11 and the ILD layer 13. In particular, corner portions of the rectangular shaped contact hole 14 suffer tensile stress which causes the cracks. It is thus difficult to form a reliable contact hole for monitoring the process steps. As a result, the yield of the semiconductor device and its reliability are reduced.

SUMMARY OF THE INVENTION

Accordingly, the present invention is directed to a method for fabricating a semiconductor device having a crack resistant contact hole and such a semiconductor device that substantially obviates one or more of the problems due to limitations and disadvantages of the related art.

An object of the present invention is to provide a method for fabricating a semiconductor device having a crack resistant contact hole and such a semiconductor device which prevents cracks from occurring at corner portions of a large sized contact hole.

These and other objects are achieved by providing a method for fabricating a semiconductor device having a crack resistant contact hole comprising the steps of: forming a lower layer pattern over a scribe lane region of a semiconductor substrate which includes the scribe lane region and a chip region; forming an insulating film over the semiconductor substrate including the lower layer pattern;

and partially removing the insulating film to form a contact hole and a groove, the contact hole exposing a portion of the lower layer pattern, and the groove surrounding the contact hole.

These and other objects are also achieved by providing a semiconductor device, comprising: a substrate having a chip region and a scribe lane region; a lower layer pattern formed over the scribe lane region; an insulating film formed over the substrate including the lower layer pattern, the insulating film including a contact hole exposing the lower layer pattern and including a groove surrounding the contact hole.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
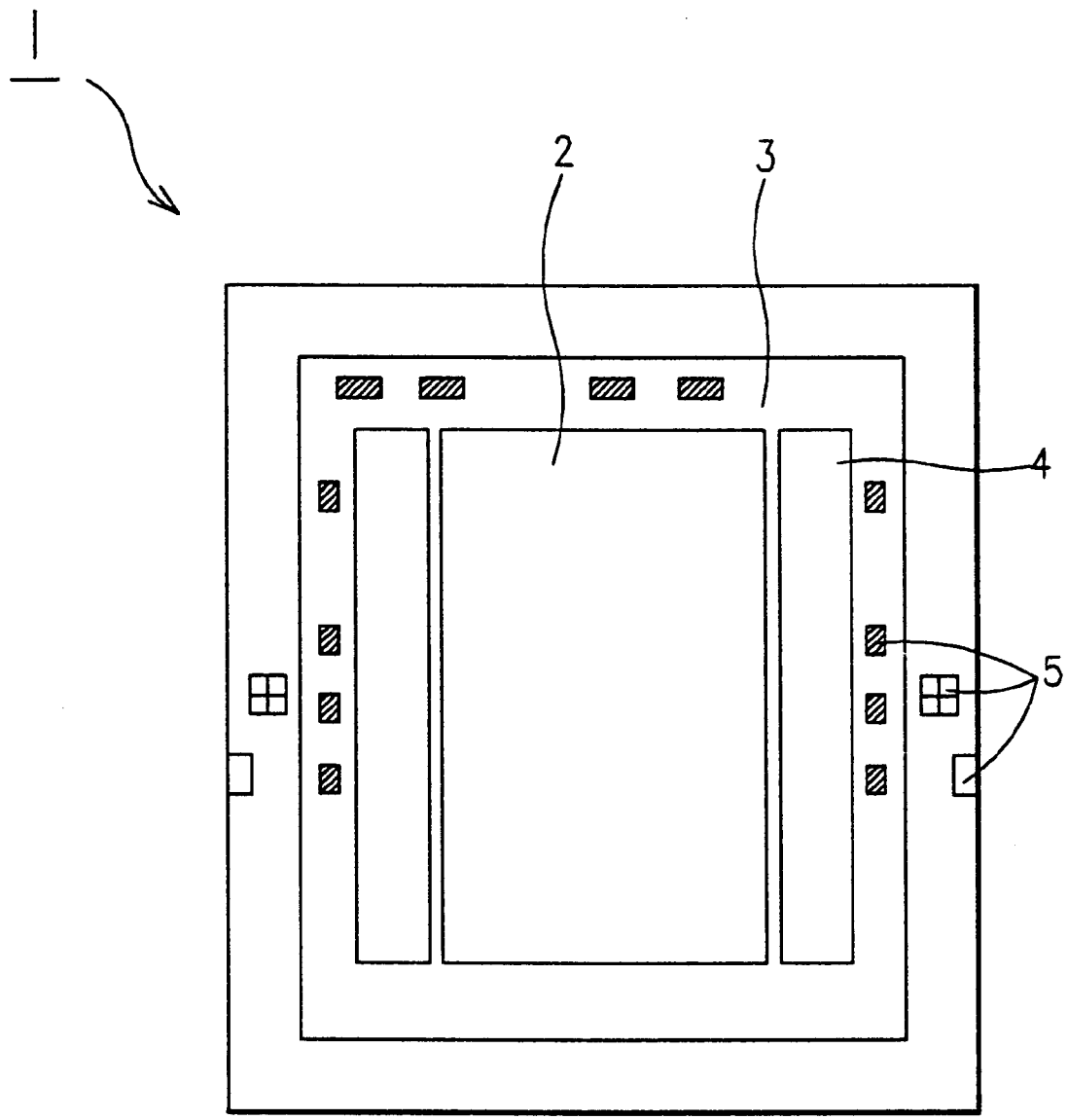
FIG. 1 is a plane view of one frame in a conventional wafer.
Figure 2:
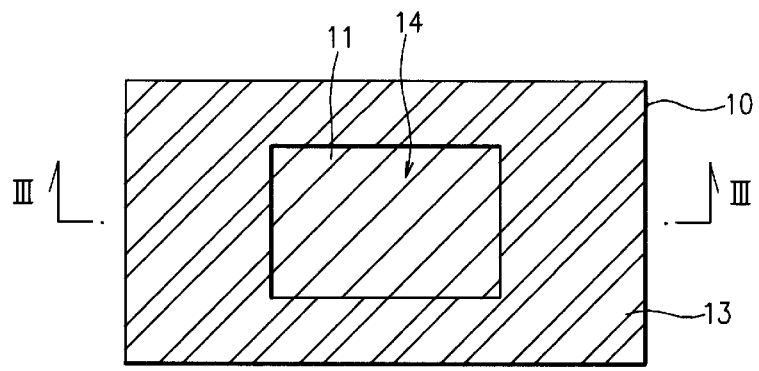
FIG. 2 is a plane view of a contact hole in a scribe lane of one frame of a conventional semiconductor device.
Figure 3A:
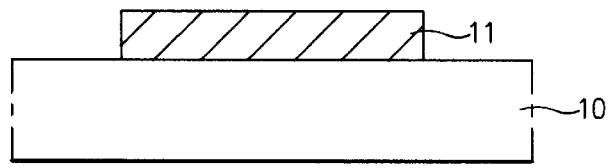
FIGS. 3a to FIG. 3c are sectional views of the conventional process steps for forming a contact hole taken along line III—III of FIG. 2.
Figure 3B:
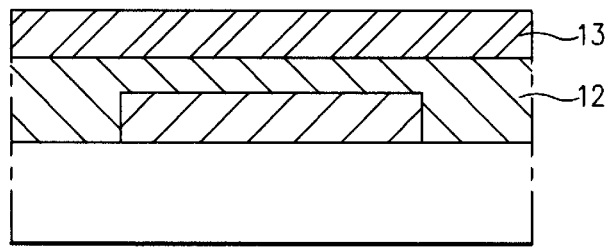
Figure 3C:
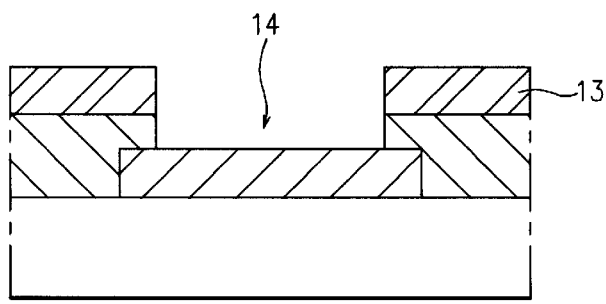
Figure 4:
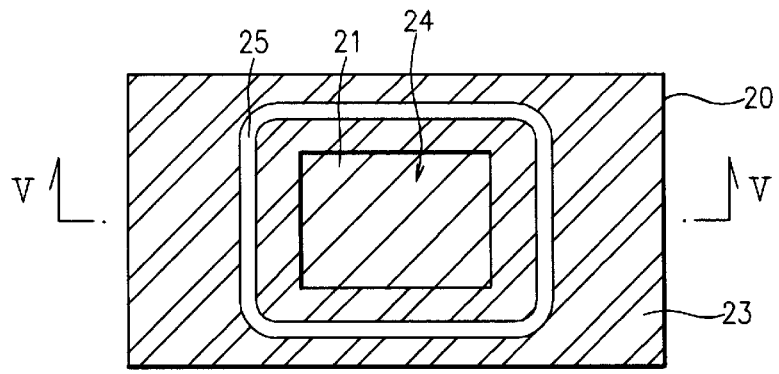
FIG. 4 is a plane view of a semiconductor device having a crack resistant contact hole for monitoring process steps according to the present invention.
Figure 5A:
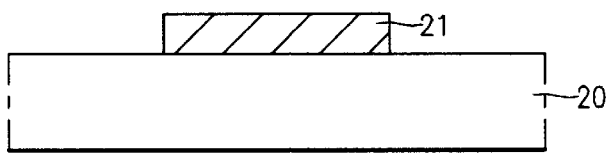
FIGS. 5a to FIG. 5c are sectional views of the process steps for forming a crack resistant contact hole taken along line V—V of FIG. 4.
Figure 5B:
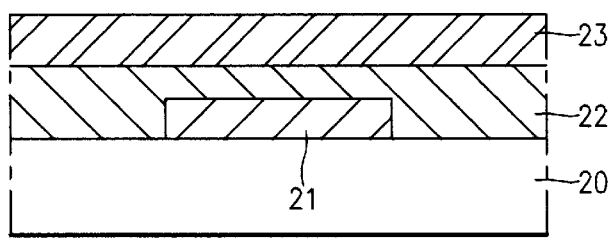
Figure 5C:
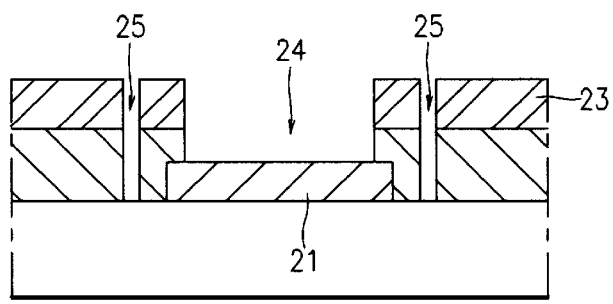

FIG. 4 is a plane view of a crack resistant contact hole in a scribe lane of one frame of a semiconductor device according to the present invention. FIG. 5a to FIG. 5c are sectional views of the process steps for forming the crack resistant contact hole taken along line V—V of FIG. 4.

As shown in FIG. 4, the semiconductor device having a crack resistant contact hole according to the present invention includes a lower layer pattern 21, an insulating film 23, a contact hole 24 and a fence groove 25. The lower layer pattern 21 is formed on a predetermined region of a semiconductor substrate 20. The insulating film 23 partially formed over the lower layer pattern 21 protects, insulates, and planarizes the lower layer pattern 21. The contact hole 24 is formed by selectively removing a predetermined region of the insulating film 23. The fence groove 25 surrounds the contact hole 24 and has a substantially rectangular shape. In addition, corner portions of the fence groove 25 are rounded.

The method for fabricating the semiconductor device having a crack resistant contact hole will be described with reference to FIGS. 5a–5c.

As shown in FIG. 5a, a lower layer is formed on the entire surface of a semiconductor substrate 20 having a chip region (not shown) and a scribe lane region. The lower layer is then selectively patterned by photolithography and etching processes to form a lower layer pattern 21 on a predetermined region of the semiconductor substrate 20. The lower layer pattern 21 is formed having desired dimensions in the scribe lane region of the semiconductor substrate 20, and is formed with dimensions suitable for monitoring the process steps.

As shown in FIG. 5b, a first insulating film 22 and a second insulating film 23 are sequentially formed over the entire surface of the semiconductor 20 including the lower layer pattern 21. The first insulating film 22 insulates or protects the lower layer pattern 21. The first insulating film 22 includes an oxide film or a nitride film. The second insulating film 23 planarizes the semiconductor substrate 20 and is formed of an ILD layer including BPSG.

As shown in FIG. 5c, the first and second insulating films 22 and 23 are selectively patterned by photolithography and etching processes to form the contact hole 24, for monitoring the process steps, and the fence groove 25. The contact hole 24 is a photo key. The fence groove 25 surrounds the contact hole 24 in a predetermined region adjacent to the contact hole 24. Corner portions of the fence groove 25 are rounded. In addition, the fence groove 25 has a width of 1.0 $\mu$m or below. After the second insulating film 23 is formed, the entire surface of the semiconductor substrate 20 is heat treated to improve planarization.

The method for fabricating the semiconductor device having a crack resistant contact hole according to the present invention has the following advantages.

In order to prevent a crack due to compressive stress or tensile stress from occurring when a large sized contact hole is formed, the ILD layer including the BPSG is selectively removed to form a fence groove surrounding the contact hole. In addition, since the corner portions of the ILD layer defining the fence groove are rounded, it is possible to prevent cracks from occurring at the corner portions of the contact hole; thereby providing a method for fabricating a semiconductor device having a reliable crack resistant contact hole.

It will be apparent to those skilled in the art that various modifications and variations can be made in the method for fabricating a semiconductor device having a crack resistant contact hole according to the present invention without departing from the spirit or scope of the invention. Thus, it is intended that the present invention cover the modifications and variations of the invention.

What is claimed is:

1. A semiconductor device, comprising:

a substrate having a chip region and a scribe lane region;

a lower layer pattern formed on the scribe lane region;

an insulating film formed over the substrate including the lower layer pattern, the insulating film including a contact hole exposing the lower layer pattern and including a groove surrounding the contact hole.

2. The semiconductor device as claimed in claim 1, wherein the insulating film includes an inter layer dielectric having borophosphosilicate glass.

3. The semiconductor device as claimed in claim 1, wherein the insulating film has a substantially planar surface.

4. The semiconductor device as claimed in claim 1, wherein the groove has a width less than or equal to 1.0 μm.

5. The semiconductor device as claimed in claim 1, wherein the groove forms a substantially rectangular shape surrounding the contact hole.

6. The semiconductor device as claimed in claim 5, wherein corner portions of the substantially rectangular shape are rounded.

7. The semiconductor device as claimed in claim 1, wherein the groove is on the scribe lane region of the substrate.

8. The semiconductor device as claimed in claim 1, wherein the groove exposes the substrate.

9. The semiconductor device as claimed in claim 1, wherein the insulating film comprises:

a first insulating film formed over the substrate including the lower layer pattern; and an inter layer dielectric layer formed on the first insulating layer.

* * * * *